United States Patent
Cheng

(10) Patent No.: US 10,027,245 B2
(45) Date of Patent: Jul. 17, 2018

(54) LOW VOLTAGE TOUCH PANEL

(71) Applicant: Aeon Labs, Santa Clara, CA (US)

(72) Inventor: Winston Cheng, El Cerrito, CA (US)

( * ) Notice: Subject to any disclaimer, the term of this patent is extended or adjusted under 35 U.S.C. 154(b) by 817 days.

(21) Appl. No.: 13/863,200

(22) Filed: Apr. 15, 2013

(65) Prior Publication Data

US 2013/0270097 A1  Oct. 17, 2013

Related U.S. Application Data

(60) Provisional application No. 61/624,197, filed on Apr. 13, 2012.

(51) Int. Cl.
| | | |
|---|---|---|
| *H03K 17/96* | (2006.01) | |
| *H02M 7/32* | (2006.01) | |
| *H02M 7/04* | (2006.01) | |
| *H05B 37/02* | (2006.01) | |

(52) U.S. Cl.
CPC ............. *H02M 7/32* (2013.01); *H02M 7/04* (2013.01); *H03K 17/962* (2013.01); *H05B 37/0272* (2013.01)

(58) Field of Classification Search
CPC ........ H03K 17/962; H02M 7/32; H02M 7/04; H05B 37/0272
See application file for complete search history.

(56) References Cited

U.S. PATENT DOCUMENTS

| | | | |
|---|---|---|---|
| 3,968,356 A | 7/1976 | Martin | |
| 6,528,957 B1 | 3/2003 | Luchaco | |
| 7,902,759 B2 | 3/2011 | Newman, Jr. | |
| 2003/0225640 A1 | 12/2003 | Yablonowski et al. | |
| 2008/0151458 A1* | 6/2008 | Beland | G05D 23/1902 361/114 |
| 2009/0071680 A1 | 3/2009 | Aller et al. | |
| 2009/0096623 A1 | 4/2009 | Roosli | |
| 2011/0022244 A1 | 1/2011 | O'Callaghan | |
| 2011/0043052 A1 | 2/2011 | Huizenga et al. | |
| 2011/0090042 A1 | 4/2011 | Leonard et al. | |
| 2011/0106996 A1 | 5/2011 | Rosso | |
| 2011/0121990 A1 | 5/2011 | Schmidt et al. | |
| 2011/0187275 A1 | 8/2011 | Giltaca et al. | |
| 2011/0245940 A1 | 10/2011 | Picco | |
| 2011/0260633 A1* | 10/2011 | Takeda | H05B 33/0815 315/192 |
| 2011/0283120 A1 | 11/2011 | Sivertsen | |
| 2011/0298741 A1* | 12/2011 | Sakai | H01H 13/83 345/173 |
| 2012/0007555 A1 | 1/2012 | Bukow | |
| 2012/0062370 A1* | 3/2012 | Feldstein | G06F 1/1626 340/13.22 |

OTHER PUBLICATIONS

International Search Report and Written Opinion, PCT/US2013/036647, dated Aug. 2, 2013.

* cited by examiner

*Primary Examiner* — Zeev V Kitov

(57) ABSTRACT

Wall mountable touch panels are described. In one embodiment, a wall mountable touch panel for controlling a load device includes a touch sensor configured to receive a user touch input and to control the load device based on the user touch input and a power interface configured to receive a low-voltage direct current (DC) power signal for powering the touch sensor. Other embodiments are also described.

17 Claims, 15 Drawing Sheets

LOW VOLTAGE TOUCH PANEL

CROSS-REFERENCE TO RELATED APPLICATION

This application is entitled to the benefit of provisional U.S. Patent Application Ser. No. 61/624,197, filed Apr. 13, 2012, the disclosure of which is incorporated by reference herein in its entirety.

FIELD OF THE INVENTION

Embodiments of the invention relate generally to electronic hardware, and, more particularly, to electrical devices and touch panels.

BACKGROUND OF THE INVENTION

Electrical devices can be used with wall-mounted electrical gang/patress boxes to control load devices, such as lights or electrical fans. However, conventional electrical devices typically output a high-voltage alternating current (AC) power signal to wall-mounted switches. In addition, conventional electrical devices generally lack the capability of wirelessly communicating with other appliances or handheld controllers.

Touch panel wall switches can be used with electrical devices to control lights or electrical fans. However, conventional capacitive touch panel wall switches are typically supplied with high-voltage AC power signals and used to drive load devices. This means that conventional capacitive touch panel wall switches require voltage transformers for transforming high-voltage AC power signals into low-voltage direct current (DC) power signals suitable for electronics components of the capacitive touch panel wall switches. While batteries can be used to supply power to conventional touch panel wall switches, batteries need to be swapped out periodically.

SUMMARY OF THE INVENTION

Wall mountable touch panels are described. In one embodiment, a wall mountable touch panel for controlling a load device includes a touch sensor configured to receive a user touch input and to control the load device based on the user touch input and a power interface configured to receive a low-voltage DC power signal for powering the touch sensor. Other embodiments are also described. The touch panel can be powered by the low-voltage output without needing an AC transformer or battery. Other embodiments are also described.

In one embodiment, a wall mountable touch panel for controlling a load device includes a touch sensor configured to receive a user touch input and to control the load device based on the user touch input and a power interface configured to receive a low-voltage DC power signal for powering the touch sensor.

In one embodiment, a wall mountable touch panel for controlling a load device includes a touch sensor configured to receive a user touch input and to control the load device based on the user touch input and a power interface configured to receive a low-voltage DC power signal for powering the touch sensor. The voltage of the low-voltage DC power signal is lower than a voltage threshold of around 36V. The wall mountable touch panel does not comprise a battery or an AC to DC transformer. No AC-DC transformation is performed in the wall mountable touch panel.

In one embodiment, a wall mountable capacitive touch panel suitable for use with an electrical gang/patress box includes a capacitive touch sensor configured to receive a user touch input and to control a light, a fan, an electronic wall outlet, or a window covering based on the user touch input and a power interface configured to receive a DC power signal having a voltage that is lower than an AC power signal that is accessible from within the electrical gang/patress box and to power the capacitive touch sensor. The capacitive touch sensor is flat and includes an interface for connection to the electrical gang/patress box. No AC-DC transformation is performed in the wall mountable capacitive touch panel.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION OF THE INVENTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
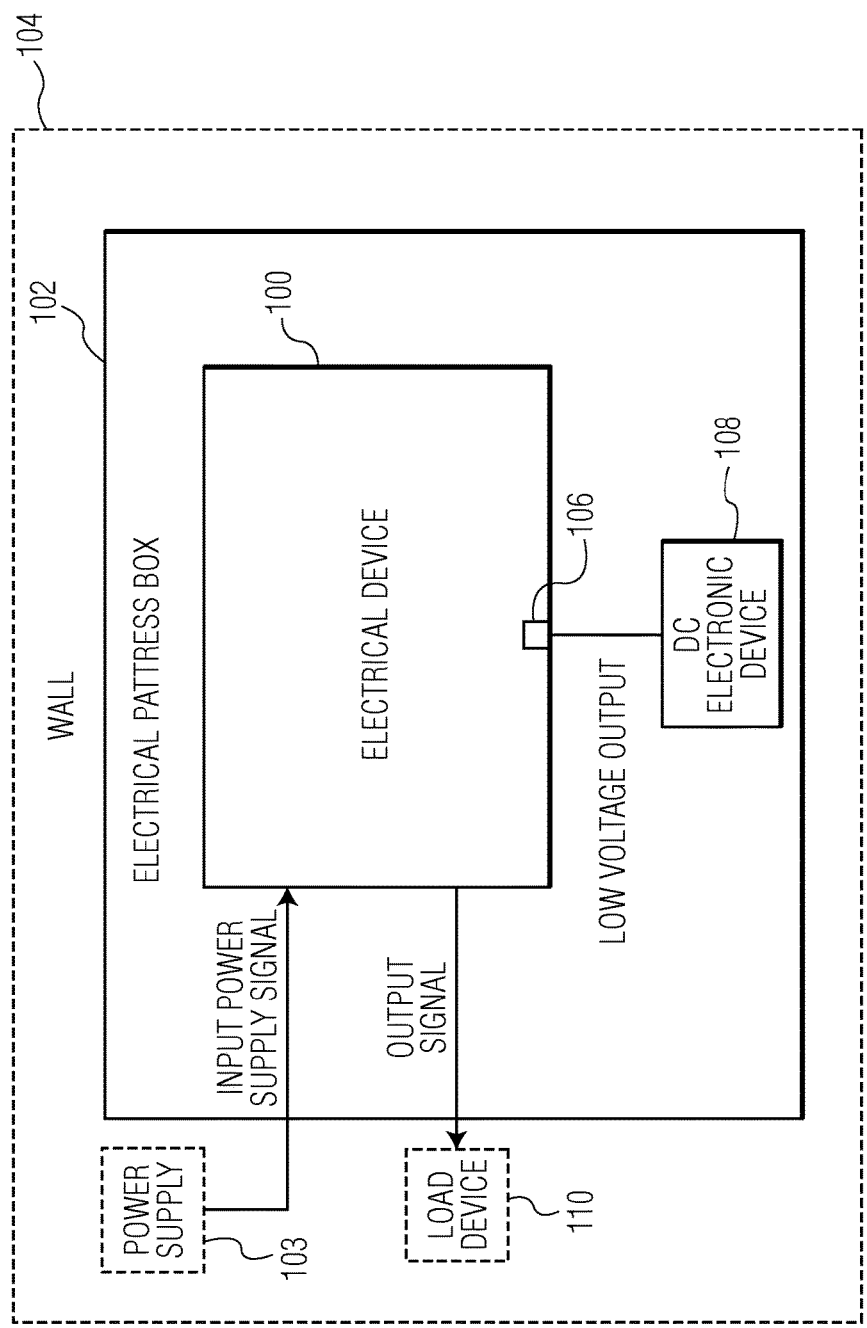
FIG. 1 is a schematic block diagram of an electrical device in accordance with an embodiment of the invention.

FIG. 1 is a schematic block diagram of an electrical device 100 in accordance with an embodiment of the invention. The electrical device may be used for various devices and applications. In an embodiment, the electrical device is an in-wall device that has a form factor that fits within a standard gang/patress box. In some embodiments, the electrical device 100 is installed in an electrical gang/patress box 102 that is mounted on the surface of a wall 102 or mounted within the wall. As is known in the art, a gang box or a patress or pattress box is a container for the space behind electrical fittings, such as, one or more power outlets, switches, dimmers, touch panels, thermostats, and security keypads. A patress box is made in standard dimensions and is mounted on the surface of the wall or embedded into the wall. A patress box is usually made of metal and/or plastic.

In the embodiment depicted in FIG. 1, the electrical device 100 receives a power supply input signal from a power supply 103 and generates a power supply output signal, which is outputted to a load device 110. The power supply may be any type of power supply. In some embodiments, the power supply is an AC power supply and the input signal is an AC power signal that is accessible from within the electrical patress box. For example, the power supply is typically the power provided within a residential or commercial building. In these embodiments, the input signal and the output signal are AC power signals. In some embodiments, the electrical device 100 includes one or more power supply interfaces that interface with the power supply 103. The load device 110 can be any suitable type of electrical load, such as a capacitive load, a resistive load, and/or an inductive load. For example, the load device 110 may be a light, a fan, an electronic wall outlet, or a window covering.

In the embodiment depicted in FIG. 1, the electrical device 100 generates a low-voltage DC output signal having a voltage that is lower than the voltage of the input power supply signal. In some embodiments, the low-voltage output signal has a voltage of less than a voltage threshold of about 36V, for example, within ±10% of 36V. In an embodiment, the low-voltage output signal has a voltage of around 3.3 Volts (V), for example, within ±10% of 3.3V. Although example voltages (36V and 3.3V) of the low-voltage output signal are provided, the voltage of the low-voltage output signal can be at any suitable value that is deemed to be "low-voltage" and is not limited to the examples provided. The electrical device 100 includes a connector 106, from which the low-voltage DC signal is outputted, to a low-voltage DC electronic device 108. In the embodiment depicted in FIG. 1, the electrical device has a low-voltage DC output that can be used to power the low-voltage DC electronic device 108, such as a touch panel, which can be powered directly by the low-voltage output without needing an AC transformer or battery. In addition, the electrical device 100 may include a built-in radio transceiver for communicating wirelessly with other devices. Consequently, the electrical device provides a capability of wirelessly controlling the load device 110.

The connector 106 may include one or more Input/Output (I/O) pins, I/O ports, or I/O sockets for connection with, for example, electric wires or signal cables. In some embodiments, the connector 106 includes one or more power supply interfaces that interface with the control device 108. The connector 106 may be located within or on a surface of the housing of the electrical device 100. Although the electrical device 100 is depicted and described with certain components and functionality, other embodiments of the electrical device may include fewer or more components to implement less or more functionality. For example, the electrical device may include multiple connectors.

The low-voltage DC electronic device 108 can be any type of electrical/electronic devices. Examples of the low-voltage DC electronic device 108 include, without limitation, switches, dimmers, touch panels, thermostats, and security keypads. In some embodiments, the electronic device 108 is a control device that is used to control the load device 110. For example, the electronic device 108 may be a wall mounted switch, a dimmer, and/or a touch panel for controlling the load device 110. In some embodiments, the low-voltage DC electronic device 108 is separate from the electrical device 100. In these embodiments, the low-voltage DC electronic device 108 is external to the electrical device 100. In other embodiments, the low-voltage DC electronic device 108 is a component of the electrical device 100.

In some embodiments, the electrical device 100 is used as a retrofit solution to fit between a building's existing wall switch and power lines that are accessible within the patress box 102, in order to provide wireless control capability. Alternatively, the electrical device 100 is used as a connection to the power supply 103 for replacing a building's existing wall switch with a low-voltage DC electronic device. The electrical device 100 looks for state changes or triggers on the connected low-voltage DC electronic device 108 and controls the load device 110 via an internal relay switch or dimming circuit (not shown in FIG. 1). For example, the electrical device 100 may include a built-in electronically controllable relay switch or dimming circuit that is used to control the load 110 (e.g., a light or a fan) that a wall-mounted switch covering the patress box is controlling.

Figure 2:
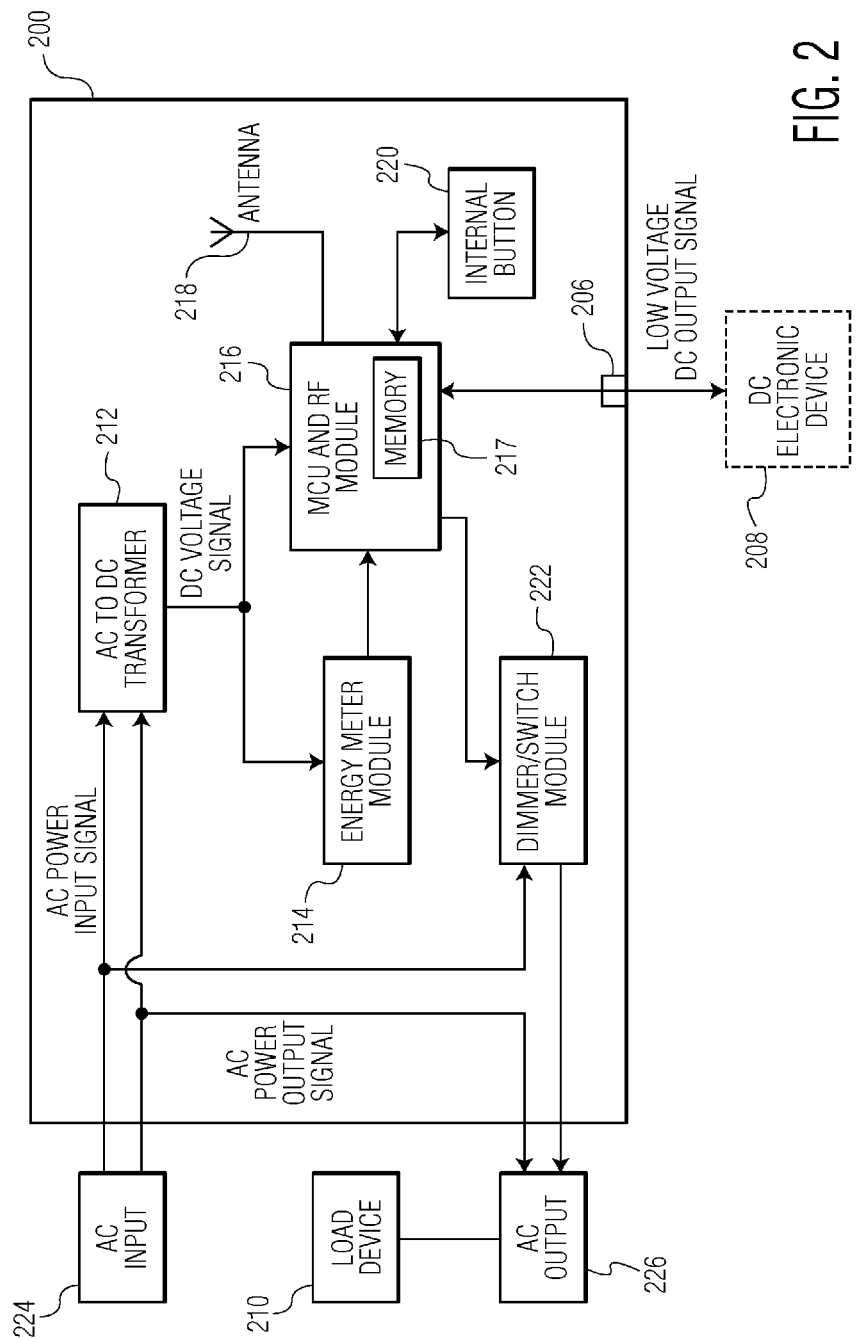
FIG. 2 depicts an embodiment of the electrical device depicted in FIG. 1.

FIG. 2 depicts an embodiment of the electrical device 100 depicted in FIG. 1. In the embodiment depicted in FIG. 2, the electrical device 200 includes a connector 206, an AC to DC transformer 212, an optional energy meter module 214, a microcontroller unit (MCU) and Radio Frequency (RF)

transceiver module 216, an antenna 218, an internal button 220, and a dimmer/switch module 222. Although the electrical device 200 is shown as including certain components, in some embodiments, the electrical device 200 includes less or more components to implement less or more functionalities. For example, the electrical device 200 may not include the energy meter module and/or the antenna 218 in some cases. In some embodiments, the MCU and RF transceiver module 216 is replaced by a microcontroller that does not include a transceiver. In an embodiment, the electrical device 200 does not have wireless communications capability. The electrical device 200 receives an AC input signal from an AC input 224 and generates an AC output signal, which is inputted into an AC output 226 for powering/controlling a load device 210. The electrical device 200 also generates a low-voltage DC signal that is inputted into a low-voltage DC electronic device 208, such as a touch panel. The connector 206, the load device 210, and the low-voltage DC electronic device 208 are similar to or the same as the connector 106, the load device 110, and the low-voltage DC electronic device 108, respectively.

The AC to DC transformer 212 of the electrical device 200 is configured to transform the AC input signal into a low DC voltage for other components of the electrical device 200. In some embodiments, the AC to DC transformer 212 uses a three-wire design that requires a neutral connection or a 2-wire connection with no neutral link. The AC to DC transformer can work with standard voltages in various countries and regions, including North America, Europe, Middle East, Central America and the Caribbean, South America, Africa, Australia and Oceania. In an embodiment, the AC to DC transformer can transform an input AC voltage of 110V/60 Hz or 230V or 240V/50 Hz into a suitable low DC voltage. For example, the AC to DC transformer can transform an AC power input voltage of around 120V to an internal DC voltage of 5V.

Figure 3:
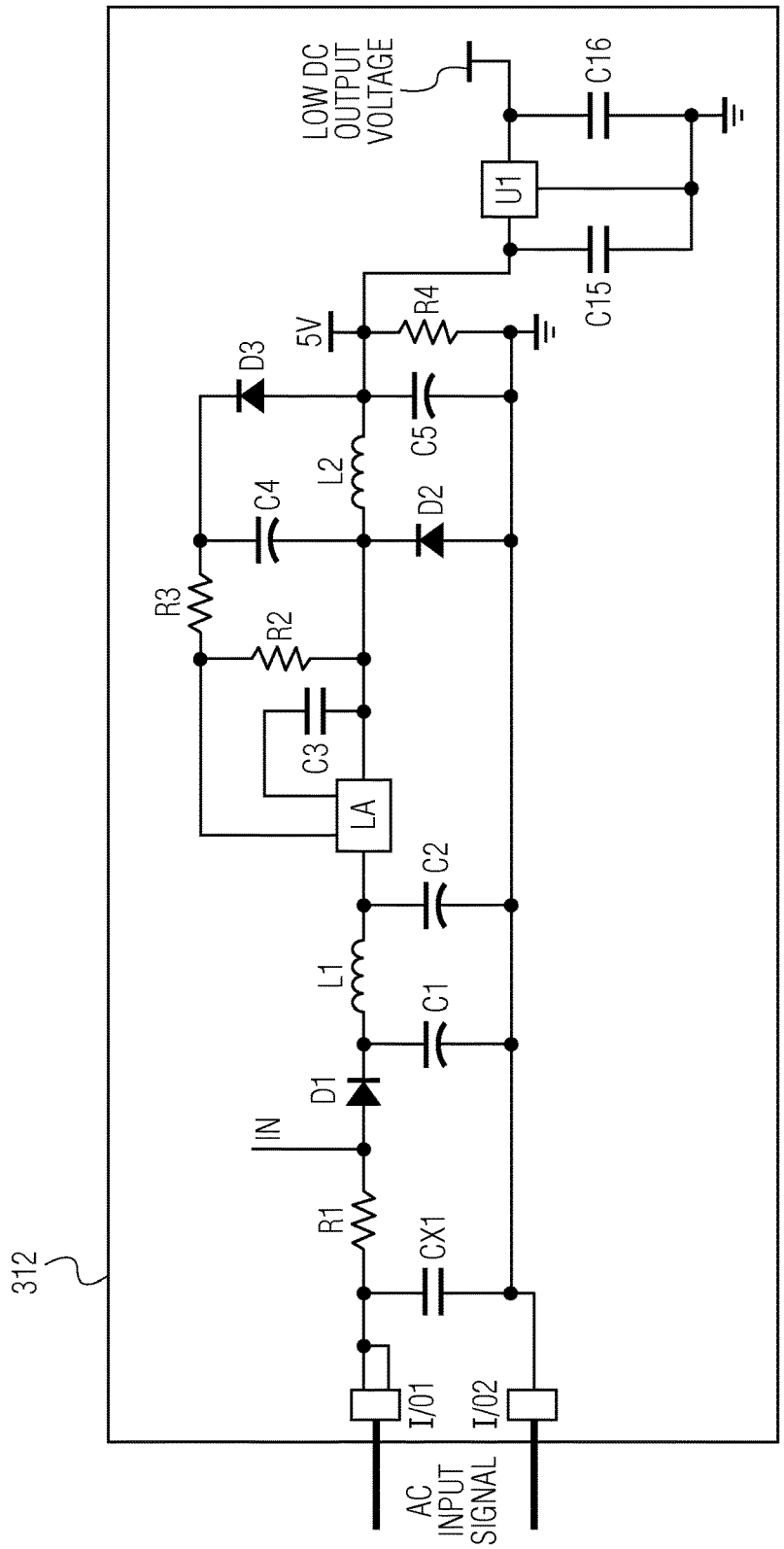
FIG. 3 depicts an embodiment of an AC to DC transformer depicted in FIG. 2.

FIG. 3 depicts an embodiment of the AC to DC transformer 212 depicted in FIG. 2. In the embodiment depicted in FIG. 3, an AC to DC transformer 312 includes I/O connectors, "I/O1," "I/O2," resistors, "R1," "R2," "R3," "R4," capacitors, "CX1," "C1," "C2," "C3," "C4," "C5," "C15," "C16," inductors, "L1," "L2," diodes, "D1," "D2," "D3," a latch, "LA," and a controller, "U1." The capacitors, "CX1," "C3," "C15," "C16," have fixed capacitances while the capacitors, "C1," "C2," "C4," "C5," are variable capacitors. In some embodiments, the capacitors, "CX1," "C3," "C15," "C16," have capacitances of 0.22 μF, 100 nF, 100 nF, and 10 μF, respectively, while the capacitors, "C1," "C2," "C4," "C5," have capacitances of 1 μF at 400V, 1 μF at 400V, 10 μF at 50V, and 470 μF at 6.3V, respectively. In some embodiments, the resistors, "R1," "R2," "R3," "R4," have resistances of 47 ohm (Ω), 2,000Ω, 4,300Ω, 1,000Ω, respectively. In some embodiments, the inductors, "L1," "L2," have inductances of 2 mH and 680 μH.

In the embodiment depicted in FIG. 3, an AC input signal from an AC input is coupled to the capacitor, "CX1," via the connectors "I/O1," "I/O2." The capacitors, "CX1," "C1," "C2," "C5," "C15," "C16," the resistor, "R4," and the diode, "D1," are connected in parallel with the capacitor, "CX1." The resistor, "R4," capacitors, "CX1," "C1," "C2," "C5," "C15," "C16," the diode, "D2," and the controller, "U1," are connected to a fixed voltage potential, such as the ground. An input signal, "IN," is inputted to a node between the resistor, "R1," and the diode, "D1." The input signal, "IN," is used to get AC Main Voltage for generating zero cross signal, which is used to generate a fire pulse (Triode for Alternating Current (TRIAC) signal) for every half period. That is, both the rising edge and the falling edge are used as time base for generating the fire pulse. In some embodiments, the input signal, "IN," is used for the dimmer version of the electrical device 200 (e.g., the dimmer/switch module acts as a dimmer) and is not used for the switch/relay version of the electrical device 200 (e.g., the dimmer/switch module acts as a switch). The resistor, "R1," is located between the AC main line and the input signal, "IN," and acts as an insurance resistance (e.g., with a resistance of only 47 ohms). The voltage of the input signal, "IN," is nearly the same as the voltage of the AC main line. In some embodiments, a 2-wire connection with no neutral link is used to connect the AC to DC transformer 312 to the main AC power and metal-oxide-semiconductor field-effect transistors (MOSFETs) can be used to dim a load, instead of TRIAC. A fixed voltage, such as 5V, is applied to the resistor, "R4." A low DC output voltage is outputted from the capacitor, "C16." In some embodiments, the AC to DC transformer 312 transforms an AC voltage of between 85V and 200V to a low DC output voltage of around 4.4V.

Turning back to FIG. 2, the energy meter module 214 of the electrical device 200 is configured to measure energy consumption of the load device 210. The energy meter module can measure the energy consumption of the load device 210 in wattage, voltage, current, and kilowatt hour (kWh). In the embodiment depicted in FIG. 2, the energy meter module reports or transmits the energy consumption parameters to the MCU and RF transceiver module 216.

The MCU and RF transceiver module 216 of the electrical device 200 is configured to control other components of the electrical device 200 (e.g., the dimmer/switch module 222, the connector 206, and/or the antenna 218) and to communicate with other RF devices through the antenna 218, in response to the DC voltage signal from the AC to DC transformer 212. In some embodiments, the MCU and RF transceiver module includes a dedicated RF transceiver unit and a dedicated controller unit. The MCU and RF transceiver module, which may be implemented in the form of a microcontroller, is powered by the AC to DC transformer 212. In some embodiments, the MCU and RF transceiver module includes a non-volatile memory unit 217. In the event of power failure, the non-volatile memory retains all programmed information relating to the operating status of the electrical device 200. Alternatively, the non-volatile memory 217 may be separate from the MCU and RF transceiver module 216.

The MCU and RF transceiver module 216 can operate in various licensed and unlicensed RF frequency bands. In some embodiments, the MCU and RF transceiver module can operation in a frequency band of around 908.42 MegaHertz (MHz) (e.g., within ±10% of 908.42 MHz) in the United States and/or in a frequency band of around 868.42 MHz (e.g., within ±10% of 868.42 MHz) in Europe. To reduce power consumption and reduce interference with other appliances, the communication range of the MCU and RF transceiver module is generally limited. For example, the MCU and RF transceiver module may have a range of around 15 meters (e.g., within ±10% of 15 meters). The MCU and RF transceiver module may be compatible with various wireless communications standards, depending upon applications in which the electrical device 200 is used for. In some embodiments, the electrical device 200 is used for home automation, for example, as a retrofit solution for wireless home automation, and the MCU and RF transceiver module is compatible with home automation communications protocols.

In some embodiments, the MCU and RF transceiver module conducts wireless communications in a manner that is compatible with Z-Wave wireless mesh communications protocol, Wifi, Zigbee, and/or Bluetooth. Although some examples of wireless communications protocols/standards are described, the MCU and RF transceiver module 216 can conduct wireless communication in any suitable wireless communications protocol/standard or any combination of suitable wireless communications protocols/standards. In some embodiments, the MCU and RF transceiver module 216 conducts wireless communication in a low data rate wireless communications protocol. As is known in the art, Z-Wave is a wireless communications protocol designed for home automation. Z-Wave was originally developed by Zen-Sys. Z-Wave technology can be used in home electronics devices and systems, such as residential and commercial lighting, home access control, entertainment systems and household appliances, for remote control applications. The Z-Wave wireless mesh communications protocol can be used to provide a mesh network for commands to hop from node to node for reliability. The Z-Wave wireless mesh communications protocol is optimized for reliable, low-latency communication of small data packets. Compared with Wi-Fi and other IEEE 802.11-based wireless Local Area Network (LAN) systems that are designed primarily for high data rate communications, the Z-Wave wireless mesh communications protocol is designed for a low data rate that offers reliable data delivery along with simplicity and flexibility. The Z-Wave wireless mesh communications protocol works in an industrial, scientific, and medical (ISM) band around 900 MHz. In these embodiments, the electrical device 200 can act as a low-cost z-wave energy meter and an appliance switch/controller. Specifically, the electrical device 200 can be used to enable z-wave command and control (e.g., on/off) for in-wall switches, dimmers, and/or touch panels. The on/off control can be done via z-wave communications, manual wall switch and/or the built-in button 220. The electrical device 200 can also be used to report immediate wattage consumption or kilowatt hour (kWh) energy usage over a period of time. The electrical device 200 can communicate with products that are Z-Wave compatible or certified devices, such as appliances, lighting controllers, and/or Z-Wave handheld remote. The electrical device 200 can also act as a repeater in the Z-Wave mesh network. Acting as a bridge for communication, the electrical device 200 can forward Z-Wave command messages to intended destinations.

The internal button 220 of the electrical device 200 is a physical button configured to receive a user input for controlling the electrical device 200. In some embodiments, the internal button 220 is used to control the MCU and RF transceiver module 216 to dim, turn on, or turn off the load 210. In some embodiments, the internal button is a physical button on a major surface of the electrical device 200 that can be activated by a user. For example, an electrician or a home owner can apply physical force to the internal button to control the electrical device 200. The electrical device 200 may include a status indication light-emitting diode (LED) (not shown in FIG. 2) and pressing the internal button can cause the LED to blink accordingly, indicating an operating status of the electrical device 200. The dimmer/switch module 222 of the electrical device 200 is configured to dim the load device 210, (e.g., reduce the supplied power to the load device 210), or turn on/off the load device 210, in response to the DC voltage signal from the AC to DC transformer 212 and/or an RF signal received at the antenna 218. The dimming of a load is not limited to reducing or increasing the light intensity of an electric light. In an embodiment, the dimmer/switch module 222 speeds up or speeds down an electric fan. In some embodiments, the dimmer/switch module 222 is controlled by the DC electronic device 208, which may be a "dry contact" or "no current" device. A "dry contact" is a set of contacts of a relay circuit which does not make or break the primary current being controlled by the relay (all the wall switches become dry contacts to the electrical device 100 or 200). Usually some other contacts or device have the job of starting or stopping the primary current being controlled. In an embodiment, the dimmer/switch module 222 is controlled solely or partially by a "dry contact" or "no current" signal. The dimmer/switch module 222 may include a relay switch or other switching components that are known in the art.

In the embodiment depicted in FIG. 2, the MCU and RF transceiver module 216 outputs a low-voltage DC output signal to the DC electronic device 208 via the connector 206. The voltage of the low-voltage DC output signal is lower than the voltage of the AC input power signal. In some embodiments, the voltage of the AC power input signal is around 120V (e.g., within ±10% of 120V) or around 230V (e.g., within ±10% of 230V), and the voltage of the low-voltage DC output signal is around 3.3V (e.g., within ±10% of 3.3V). Although an example voltage (3.3V) of the low-voltage DC output signal is provided, the voltage of the low-voltage DC output signal can be at any suitable value and is not limited to the example provided. The connector 206 may include one or more I/O pins, ports, or sockets. In some embodiments, the connector 206 includes one or more power supply interfaces that interface with the DC electronic device 208.

Figure 4:
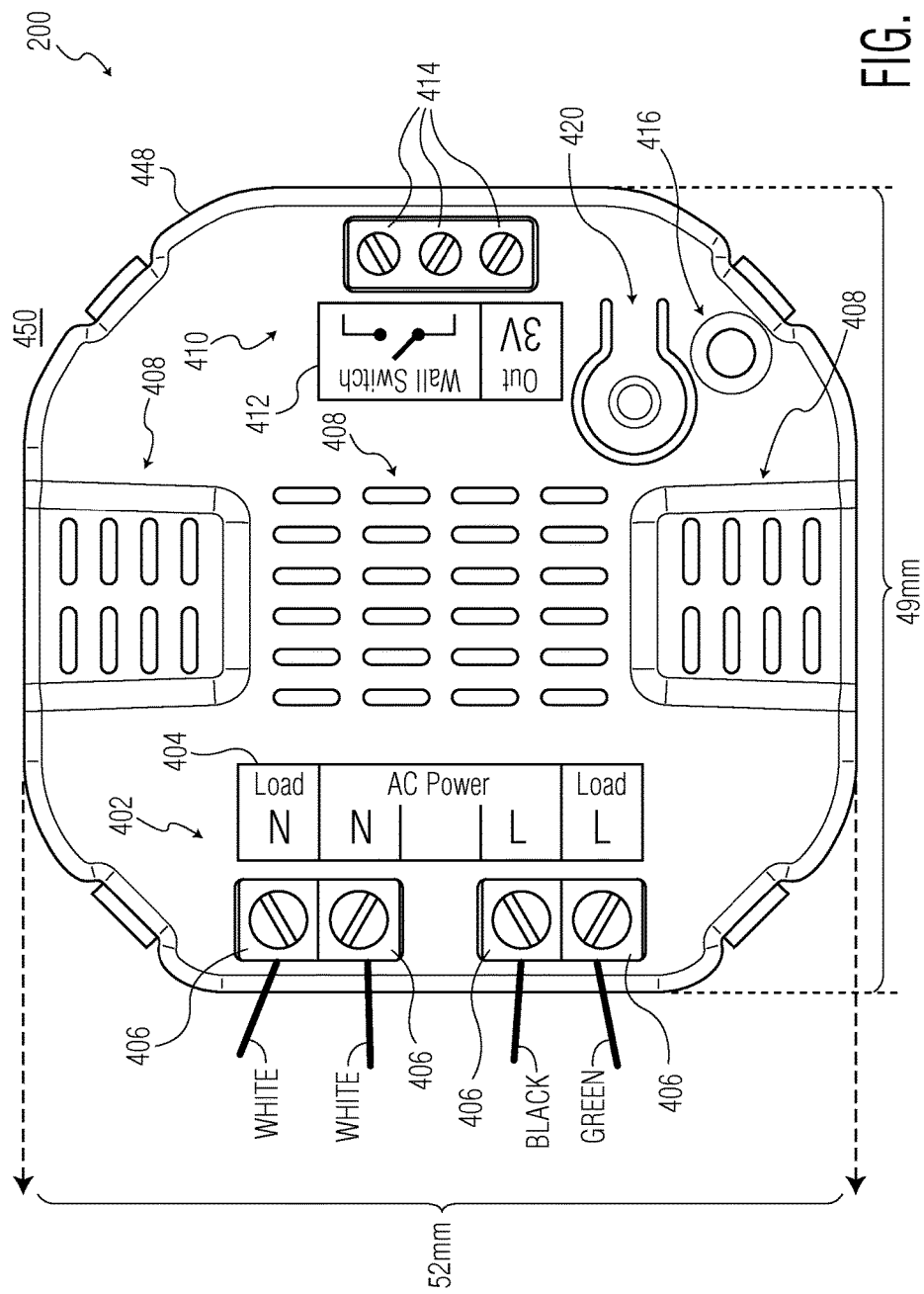
FIG. 4 shows a two-dimensional top view of the electrical device depicted in FIG. 2 in accordance with an embodiment of the invention.
Figure 5:
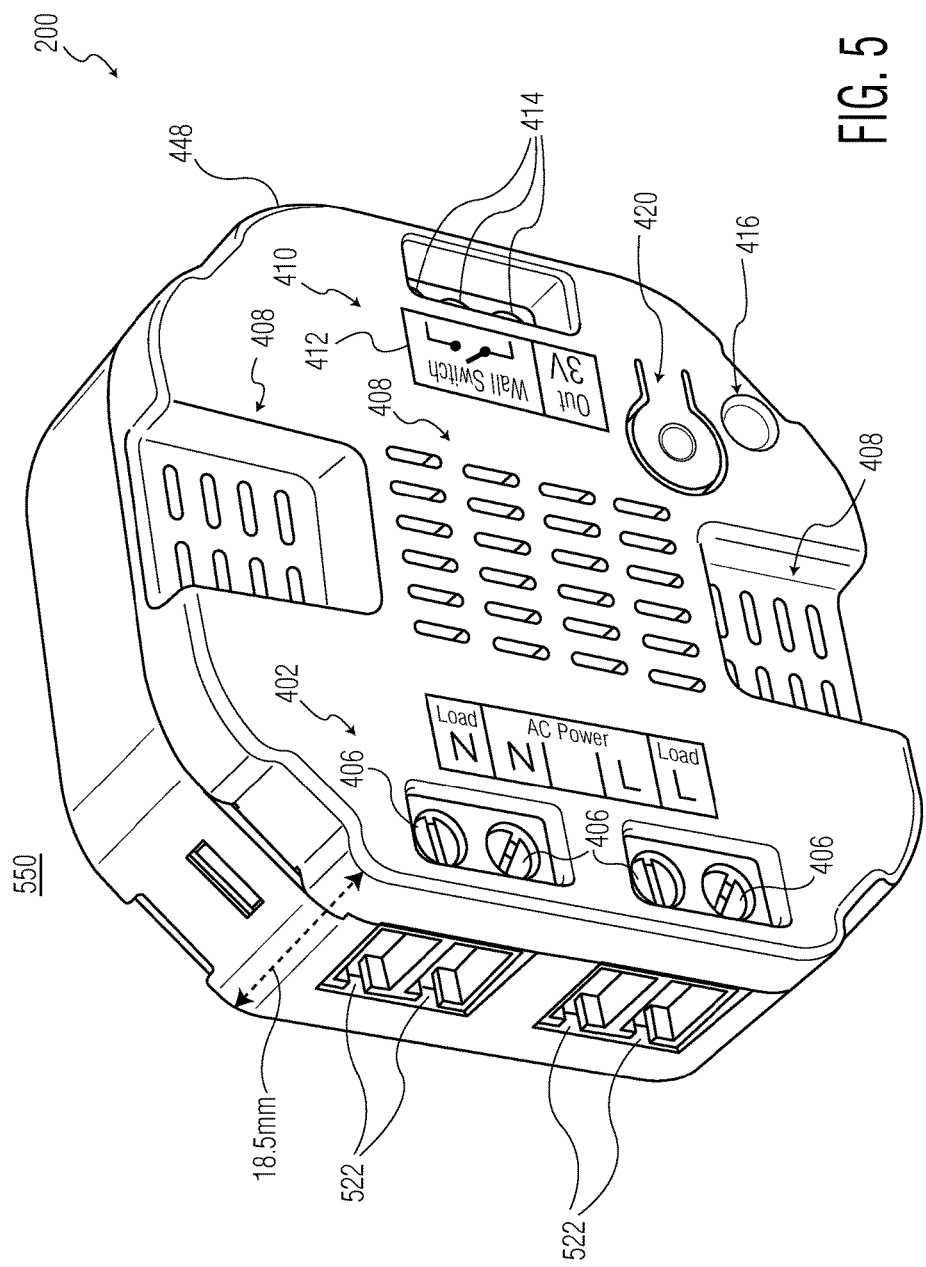
FIG. 5 shows a perspective top view of the electrical device depicted in FIG. 2 that corresponds to the two-dimensional top view shown in FIG. 4.

FIG. 4 shows a two-dimensional top view 450 of the electrical device 200 in accordance with an embodiment of the invention while FIG. 5 shows a perspective top view 550 of the electrical device 200 that corresponds to the two-dimensional top view shown in FIG. 4. In the embodiment depicted in FIG. 4, the housing 448 of the electrical device 200 can be made of plastic and/or metal, or any other suitable material. The top view 450 shows the housing 448, an AC power interface 402, thermal dissipation openings 408 used for the thermal dissipation of the electrical device 200, a DC power interface 410, an LED 418, and a button 420. Some components of the electrical device 200 shown in FIG. 2, such as the AC to DC transformer 212, the energy meter module 214, the MCU and RF transceiver module 216, the antenna 218, and the dimmer/switch module 222, are hosted within the housing 408 of the electrical device 200 and, consequently, are not shown in FIGS. 4 and 5.

In the embodiments depicted in FIGS. 4 and 5, each of the AC power interface 402 and the DC power interface 410 is a screw-type power interface that includes at least one screw and at least one wire socket controllable by the at least one screw. The AC power interface 402 includes a label 404 and four screws 406 that are labeled by a label 404. Four sockets (not shown in FIG. 4) are located underneath the four screws 406 and are connected to power wires/cables. Adjusting the screws 406 can cause the power cables to be connected or disconnected from the electrical device 200. Although the electrical device 200 is shown in the top view 450 as being connected to electric wires in white, black, and green, in other embodiments, electric wires in other colors are used. The DC power interface 410, which is an embodiment of the connector 206 depicted in FIG. 2, includes a label 412 and three screws 414 that are labeled by a label 412. Three sockets (not shown in FIG. 4) are located underneath the three screws 414 and are connected to power cables (not shown in FIG. 4). Adjusting the screws 414 can cause the power cables to be connected or disconnected from the electrical device 200. The three sockets controlled by the three screws 414 are used to output a low-voltage DC output to the low-voltage DC electronic device 208 (shown in FIG. 2). Depending on the type of the low-voltage DC electronic device 208, two sockets or all three sockets are used to connect wires between the low-voltage DC electronic device 208 and the electrical device 200. In some embodiments, the two sockets that are controlled by the screws 414 labeled, "Wall Switch," include or are connected to at least one dry contact sensor that detects a "dry contact," "no current," signal/device. For example, for a wall-mountable light switch, two sockets that are controlled by the screws 414 under the label, "Wall Switch," are used to connect wires between the light switch and the electrical device 200. For a touch panel, all of three sockets are used to connect wires between the touch panel and the electrical device 200 to supply power to the touch sensor and the LED back light of the touch panel. In some embodiments, all of the three sockets controlled by the three screws 414 have the same voltage potential. For example, all of the three sockets controlled by the three screws 414 have a voltage of around 3.3 Volts (V), for example, within ±10% of 3.3V. Although an example voltage (3.3V) is provided, the voltage of the three sockets controlled by the three screws 414 can be at any suitable value and is not limited to the example provided. FIG. 5 shows a three-dimensional top view 550 of the electrical device 200 that corresponds to the two-dimensional top view 450 shown in FIG. 4. The three-dimensional top view 550 shows four sockets 522 controllable by the screws 406.

Turning back to FIG. 4, the LED 418 is used to indicate the working status of the electrical device 200. The button 420, which is an embodiment of the internal button 220 depicted in FIG. 2, is a physical button on the surface of the electrical device 200. A user, such as an electrician or a home owner, can apply physical force to the button 420 to control the electrical device 200. For example, pressing of the button can cause the LED 418 to blink accordingly, indicating the operating status of the electrical device 200.

In the embodiment depicted in FIGS. 4 and 5, the electrical device 200 has a small form factor that fits within most gang/patress boxes worldwide. For example, the electrical device 200 may have a dimension of 52×49×18.5 millimeters (mm) (as labeled in FIGS. 4 and 5), which is smaller than the dimensions of standard gang/patress boxes. For example, a standard gang box typically has a dimension of 2.375×4.5×1.5-2.5 (1.5-2.5 is the range of the depth) inches and a standard pattress box typically has a dimension of 86×86×30-44 (30-44 is the range of the depth) mm. Consequently, the electrical device 200 can fit within most gang/patress boxes worldwide.

Figure 6:
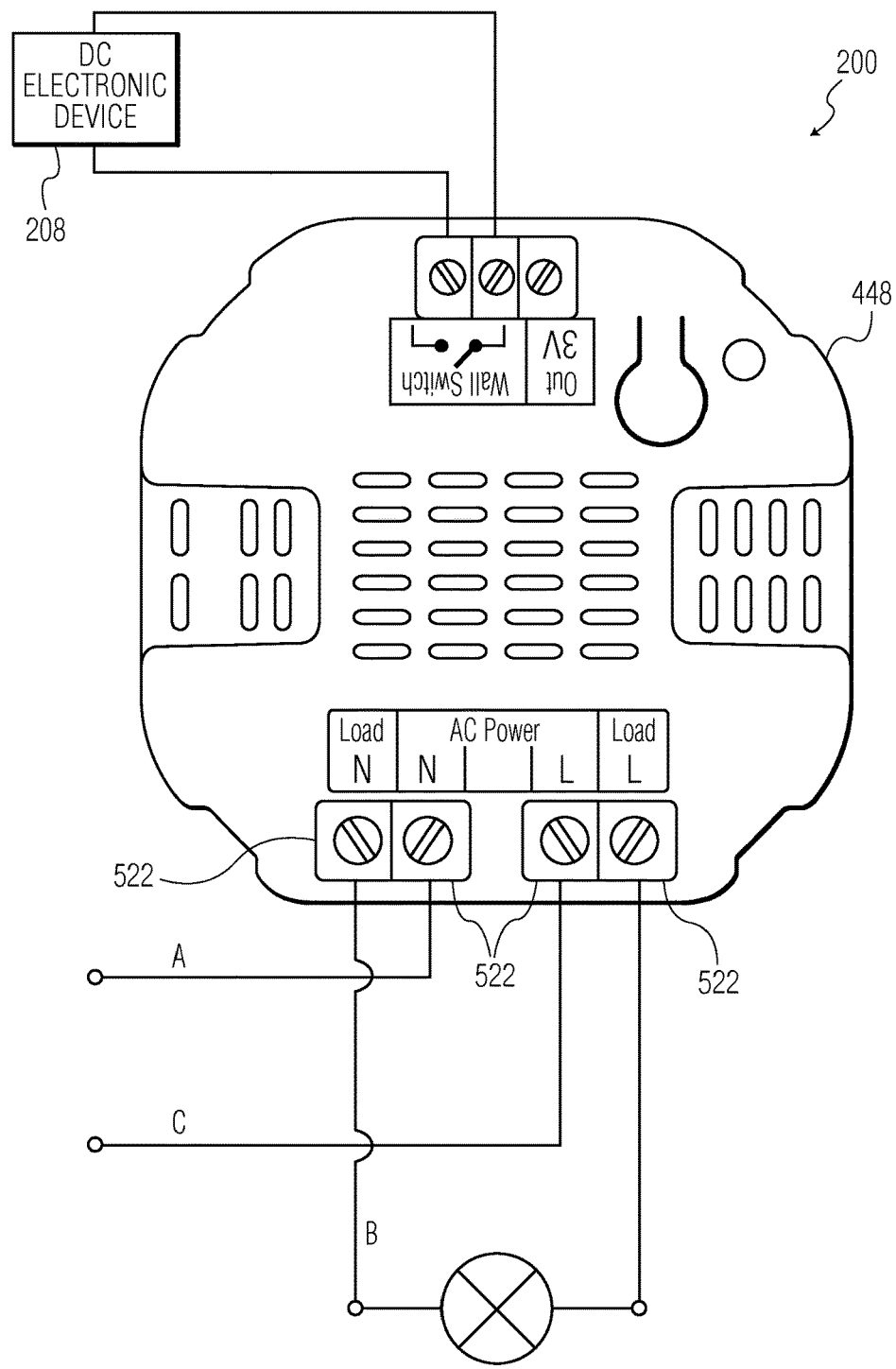
FIGS. 6 and 7 depict two examples of a 3-wire connection that can be used to power the electrical device depicted in FIG. 2.
Figure 7:
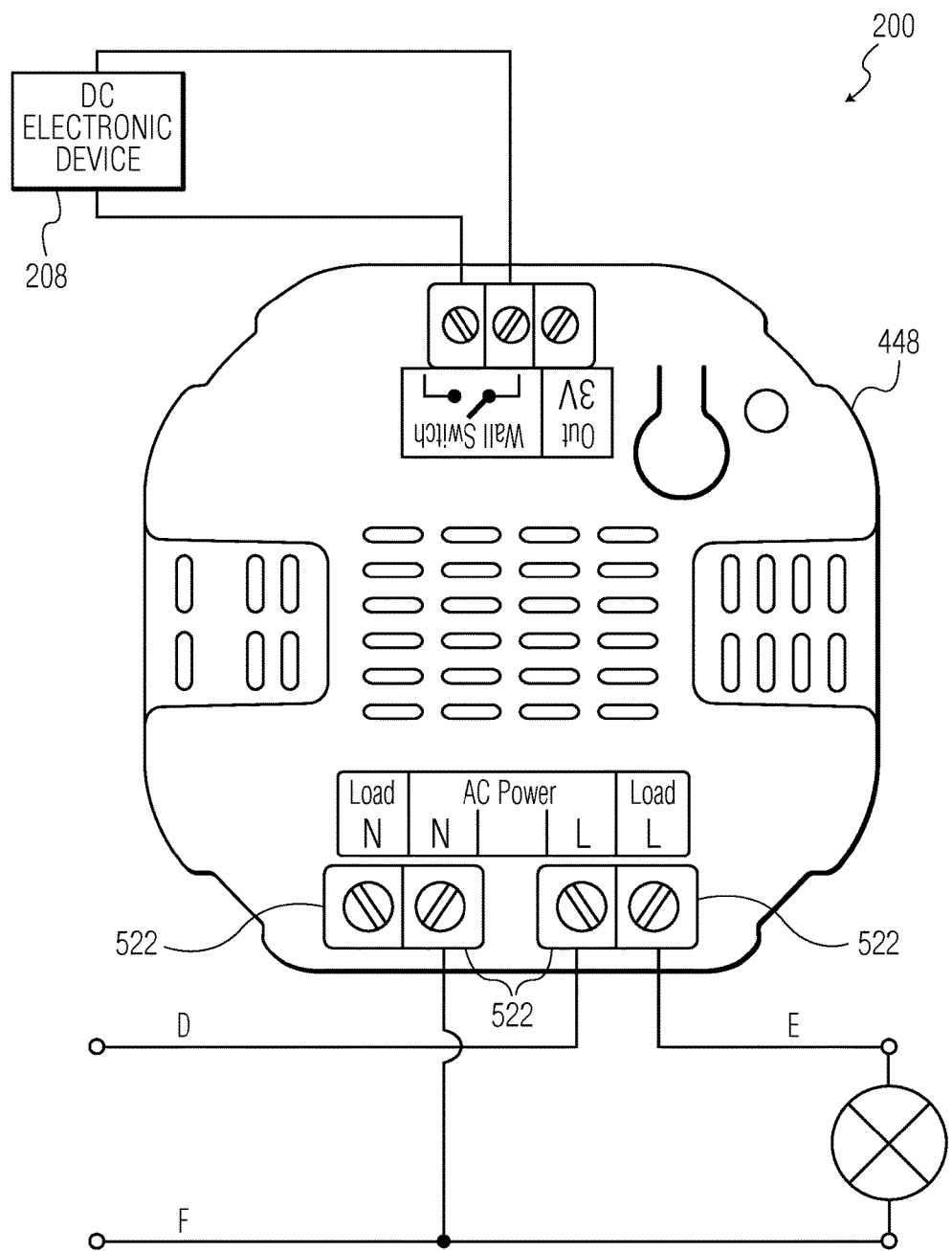

In some embodiments, the electrical device 200 is powered by a 3-wire connection that includes a neutral link or a 2-wire connection with no neutral link. FIGS. 6 and 7 depict two examples of a 3-wire connection that can be used to power the electrical device 200. In the connection diagram of FIG. 6, wires "A," "B," and "C," are connected to the input AC power sockets 522 of the electrical device 200. In the three wires, "A," "B," and "C," wire, "B," is a neutral link. In the connection diagram of FIG. 7, wires "D," "E," and "F," are connected to the input AC power sockets 522 of the electrical device 200. In the three wires, "D,'" "E," and "F," wire, "E," is a neutral link.

Figure 8:
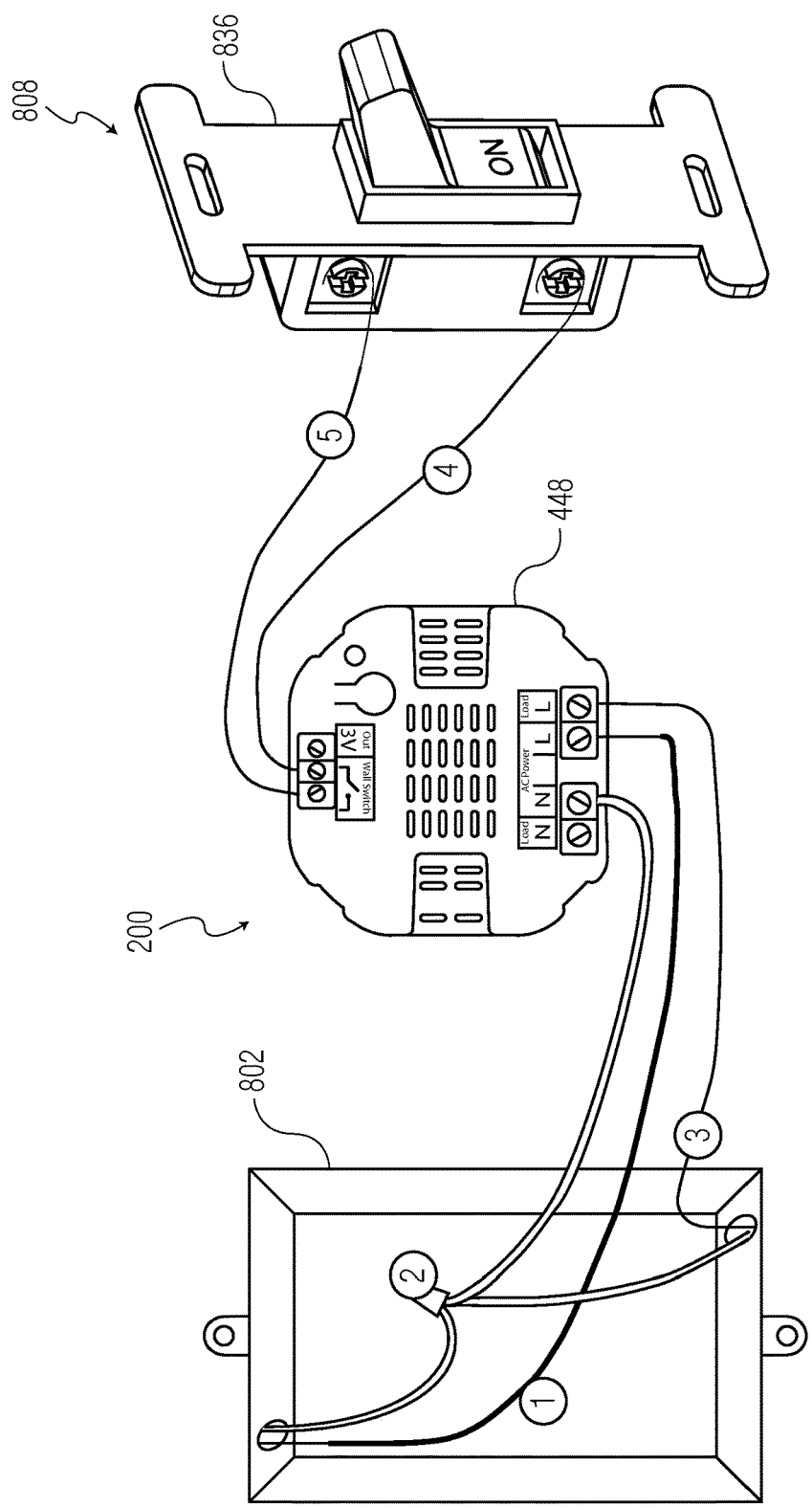
FIGS. 8 and 9 illustrate a process of mounting an electrical device into a wall-mounted electrical gang/patress box.
Figure 9:
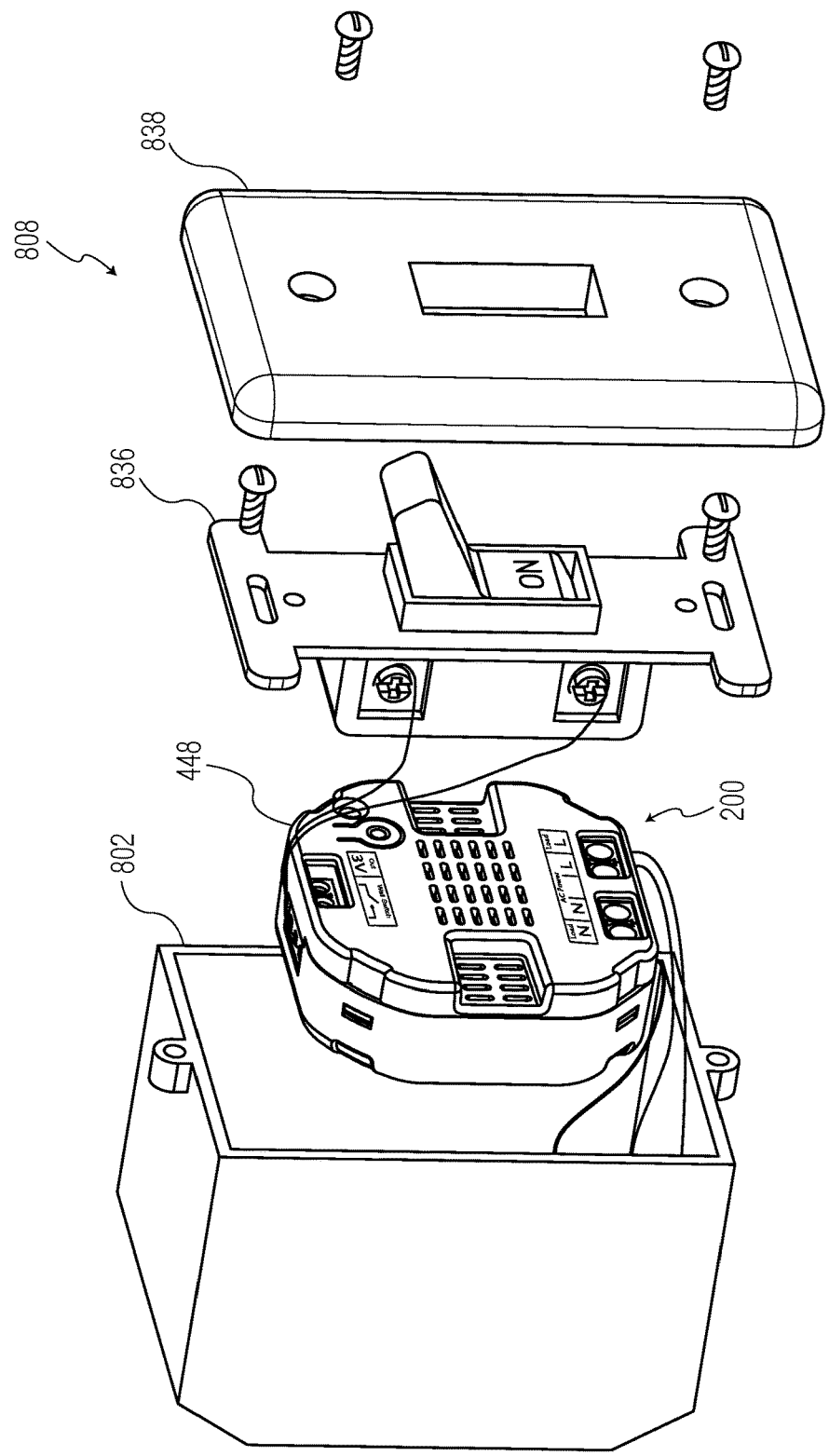

In some embodiments, the electrical device 100 or 200 is used with a building's existing wall switch 808. FIGS. 8 and 9 show a process of mounting the electrical device 200 as depicted in FIG. 4 into a wall-mountable electrical gang/patress box 802. As shown in FIG. 8, the mounting process includes connecting the electrical device 200 with an AC power supply via a hot (live) wire 1, a neutral wire 2, and a load wire 3 and connecting the electrical device 200 with a switch board 836 of the switch 808 via wires 4, 5. As shown in FIG. 9, after the wires connections, the mounting process includes positioning all wires to provide room for the electrical device 200, placing the electrical device 200 inside the electrical gang/patress box 802, screwing back the switch board 836, placing a box cover 838 on top of the switch board 836, and screwing the cover 838 onto the electrical gang/patress box 802.

Figure 10:
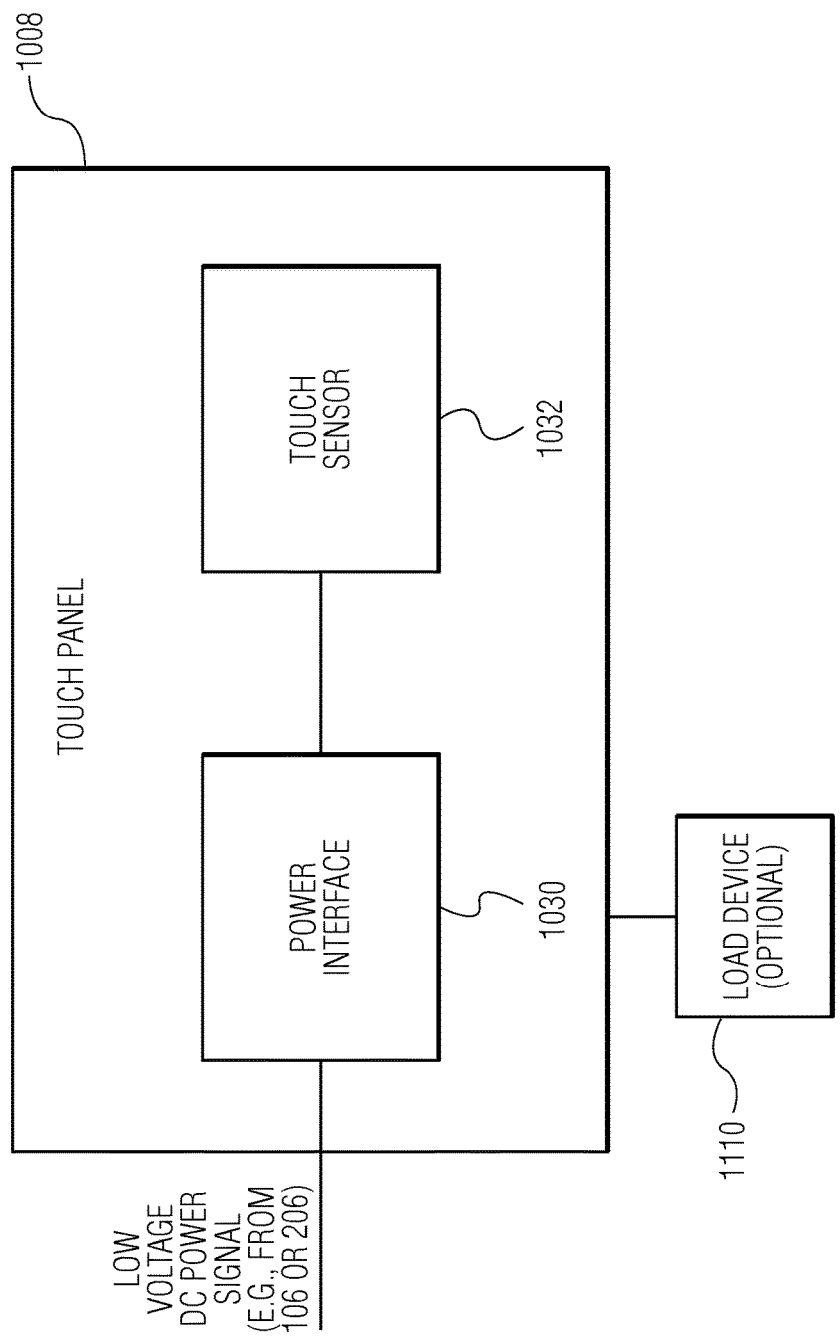
FIG. 10 is a schematic block diagram of a touch panel in accordance with an embodiment of the invention.

In some embodiments, the electrical device 100 or 200 is used to replace a building's existing wall switch with another control device, such as, the DC electronic device 108, 208. FIG. 10 is a schematic block diagram of a touch panel in accordance with an embodiment of the invention. In the embodiment depicted in FIG. 10, a touch panel 1008 includes a power interface 1030 and a touch sensor 1032. The power interface 1030 is configured to receive a low DC voltage input from, for example, the connector 106 or 206 of the electrical device 100 or 200, for powering the touch sensor. In some embodiments, the low-voltage DC power signal used to power the touch sensor is supplied from a device other than the electrical device 100 or 200. In these embodiments, the touch panel can be used with other power supply. In some embodiments, no AC-DC transformation is performed in the wall mountable touch panel 1008. In these embodiments, the wall mountable touch panel 1008 does not transform an AC power signal into the low-voltage DC power signal that is used to power the touch sensor 1032. In an embodiment, the touch sensor 1032 is powered solely by the low-voltage DC power signal. In an embodiment, the wall mountable touch panel does not include/require any AC to DC transformer or battery. The touch panel 1008 can be used with the electrical device 100 or 200 as the DC electronic device 108 or 208.

In the embodiment depicted in FIG. 10, the touch panel 1008 is a wall mountable touch panel for controlling a load device, which may be the load device 110 or 210 shown in FIG. 1 and FIG. 2, or a load device 1110. The touch sensor 1032 is configured to receive a user input (i.e., user touch) and to communicate, for example, with the electrical device 100 or 200 to control (e.g., switch on, switch off, or dim (e.g., reduce the supplied power) the load device 110, 210, or 1110 based on the user input. In some embodiments, the touch sensor controls on/off of the load device 110, 210, or 1110 and can also control the dimming by continuous contact. The load device 1110 is similar to or the same as the load device 110 or 210 depicted in FIG. 1 and FIG. 2. In some embodiments, the load device 1110 is optional. In some embodiments, the touch panel 1008 may be used to control the load device 110, 210, or 1110 either directly or indirectly. In some embodiments, the touch panel does not directly control the load device, but rather, sends a signal to the electrical device 100 or 200 so that the electrical device 100 or 200 knows how to control the load device. For example, the touch panel 1008 may be used to control the electrical device 100 or 200, which in turn controls the load device 110 or 210. Although the load device 1110 is shown in FIG. 10 as being directly connected to the touch panel 1008, in some embodiments, the load device 1110 is connected to the touch panel through an intermediate device. In an embodiment, the load device 1110 is connected to the touch panel 1008 via the electrical device 100 or 200. In this embodiment, the load device is controlled at least partially by the electrical device 100 or 200, such as the MCU and RF transceiver module 216 and the dimmer/switch module 222 depicted in FIG. 2. For the ease of use (e.g., at night or for disabled personnel), the touch sensor 1032 may have LED back light and/or may generate a sound signal in each user interaction. In some embodiments, the touch sensor 1032 includes a sound generation module, such as an integrated sound chip, and a speaker implemented in hardware. In the embodiment depicted in FIG. 10, the touch panel 1008 is a no load and low voltage touch panel, which can be used to replace existing wall mounted switches, dimmers, and/or touch panels. A no load touch panel is a touch panel that has no electrical load. For example, a no load touch panel is a touch panel that does not supply power to any electrical load. In some embodiments, a no load touch panel is a touch panel that can neither supply nor pass power through itself to drive a load device, such as, a light or a fan. The touch panel 1008 can be any type of suitable touch panels. In the embodiment depicted in FIG. 10, the touch panel 1008 is a capacitive touch panel with a capacitive touch sensor 1032. As is known in the art, capacitive sensing is based on capacitive coupling that takes human body capacitance as input. A capacitive sensor can detect the change in capacitance caused by human touch. A capacitive touch sensor is typically more responsive than a resistive touch sensor. However, in other embodiments, the touch panel 1008 may be a resistive touch panel, a surface acoustic wave touch panel, an infrared acrylic projection/grid touch panel, or an optical touch panel.

Conventional capacitive touch wall switches take high-voltage AC power signals as input to function, as AC power supplied through the wall has a high-voltage (e.g., 120V). This means that conventional capacitive touch wall switches require voltage transformers for transforming high-voltage AC power signals into low-voltage direct current (DC) power signals suitable for electronics components of the capacitive touch wall switches. While batteries can be used to supply power to conventional touch panel wall switches, batteries need to be swapped out periodically. In contrast with a conventional capacitive touch wall switch, the load current does not go through the touch panel 1008. Compared with a conventional capacitive touch wall switch, the touch panel 1008 can save on material cost and reduce the product size by taking advantage of the low-voltage DC output provided by the electrical device 100 or 200. Because low-voltage power can be supplied constantly via the low voltage output on the electrical device 100 or 200, the capacitive touch panel 1008 needs no batteries or AC transformers to convert high-voltage AC to low-voltage DC. Because the capacitive touch panel 1008 does not require batteries, the user experience of using touch wall switches can be improved in terms of lower maintenance. In addition, because neither batteries nor AC transformers are required for the capacitive touch panel 1008, the capacitive touch panel 1008 can have a rather flat form factor that does not protrude into the gang/patress box 102, which creates more room within the gang/patress box for the electrical device 100 or 200. Further, compared to a traditional capacitive touch wall switch that includes a high voltage relay or dimmer controller, the capacitive touch panel 1008 does not need a high voltage relay or dimmer controller. Consequently, the material cost of the capacitive touch panel 1008 can be saved and the product size of the capacitive touch panel 1008 can be reduced.

In an embodiment, the voltage of the low-voltage DC power signal is lower than a voltage threshold, which is around 36V (e.g., within ±10% of 36V). In some embodiments, the touch panel 1008 can operate in a low DC voltage between around zero volt and around 3.3V. Although some example voltages (36V and 3.3V) of the low-voltage DC power signal are provided, the voltage of the low-voltage DC power signal can be at any suitable value and is not limited to the examples provided. The electrical device 100 or 200 and the no load and low voltage touch panel 1008 can be applicable to home automation applications. For example, the touch panel 1008 can be applicable to home and building control of, for example, lighting, climate (i.e., fans), electronic wall outlets, and/or window coverings.

In some embodiments, the touch panel 1008 is a "dry contact" touch panel. A "dry contact" is a set of contacts of a relay circuit which does not make or break the primary current being controlled by the relay (all the wall switches become dry contacts to the electrical device 100 or 200). Usually some other contacts or device have the job of starting or stopping the primary current being controlled. For example, a reed relay matrix switch is normally switched with all contacts dry. After the contacts are all connected, a wire spring relay is energized and connects a supervisory scan point, or main switch, through which the primary current being controlled then flows. Dry contacts are primarily employed in 49 volt or less (low voltage) distribution circuits.

Figure 11:
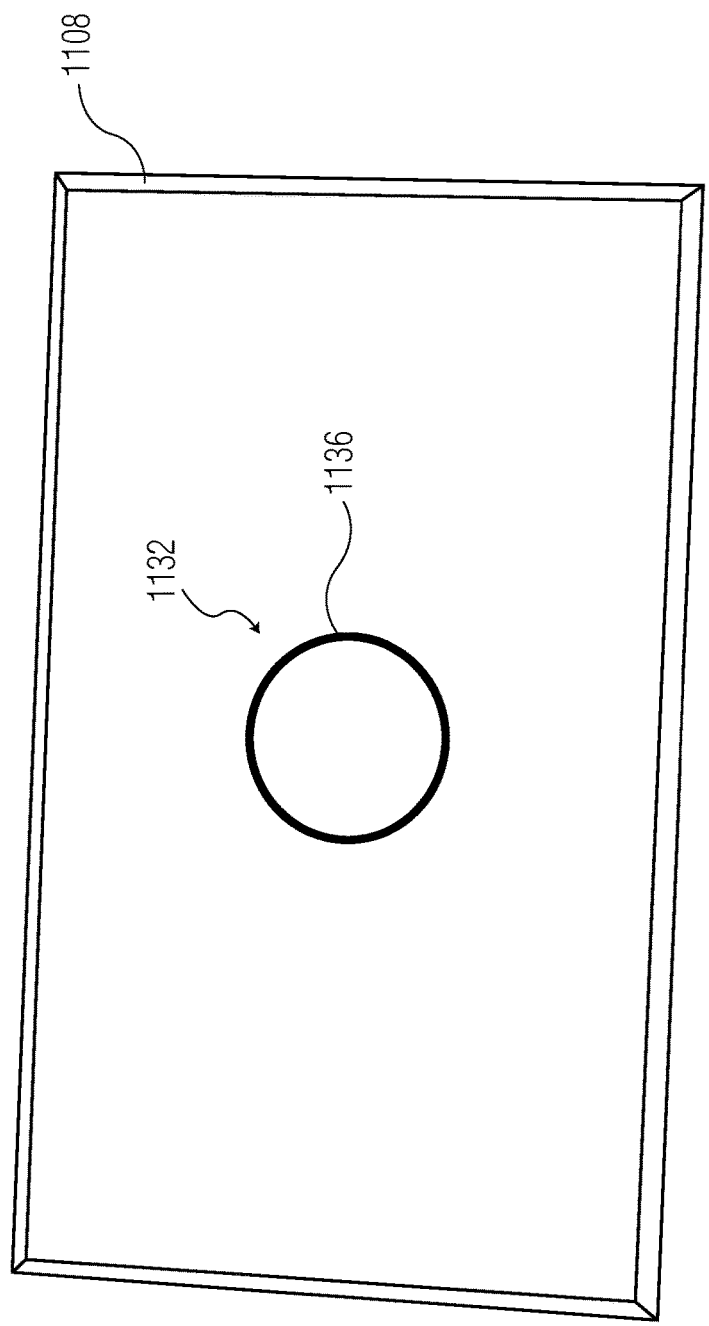
FIGS. 11-13 depict three embodiments of the touch panel depicted in FIG. 10.
Figure 12:
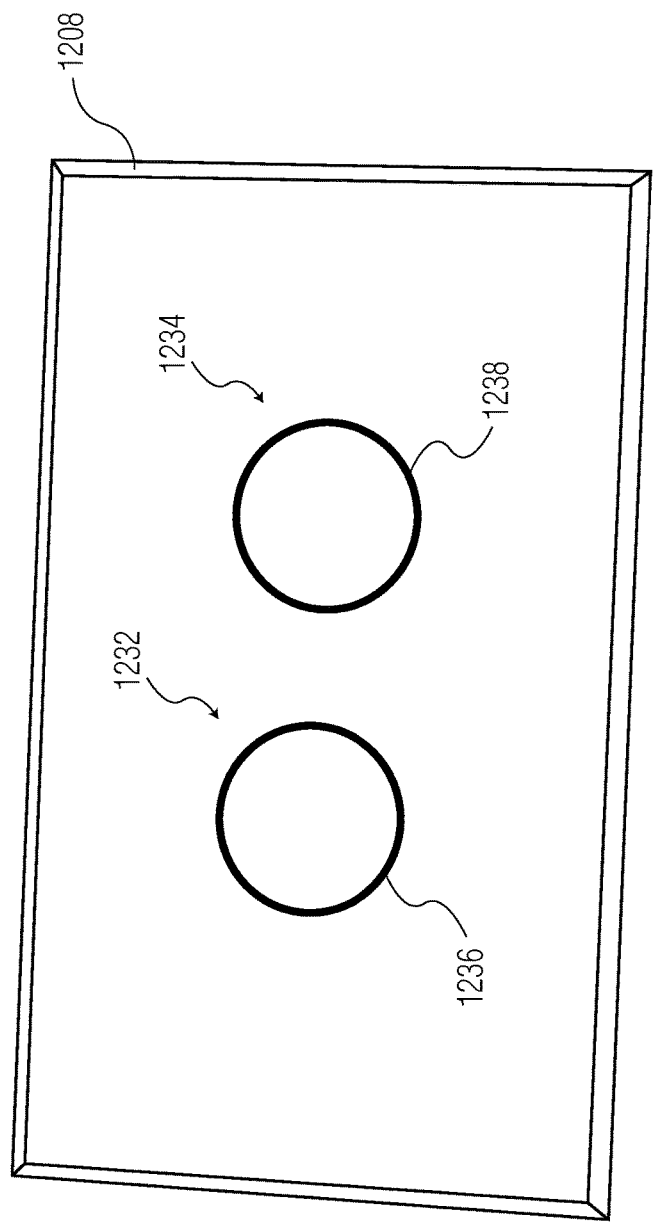
Figure 13:
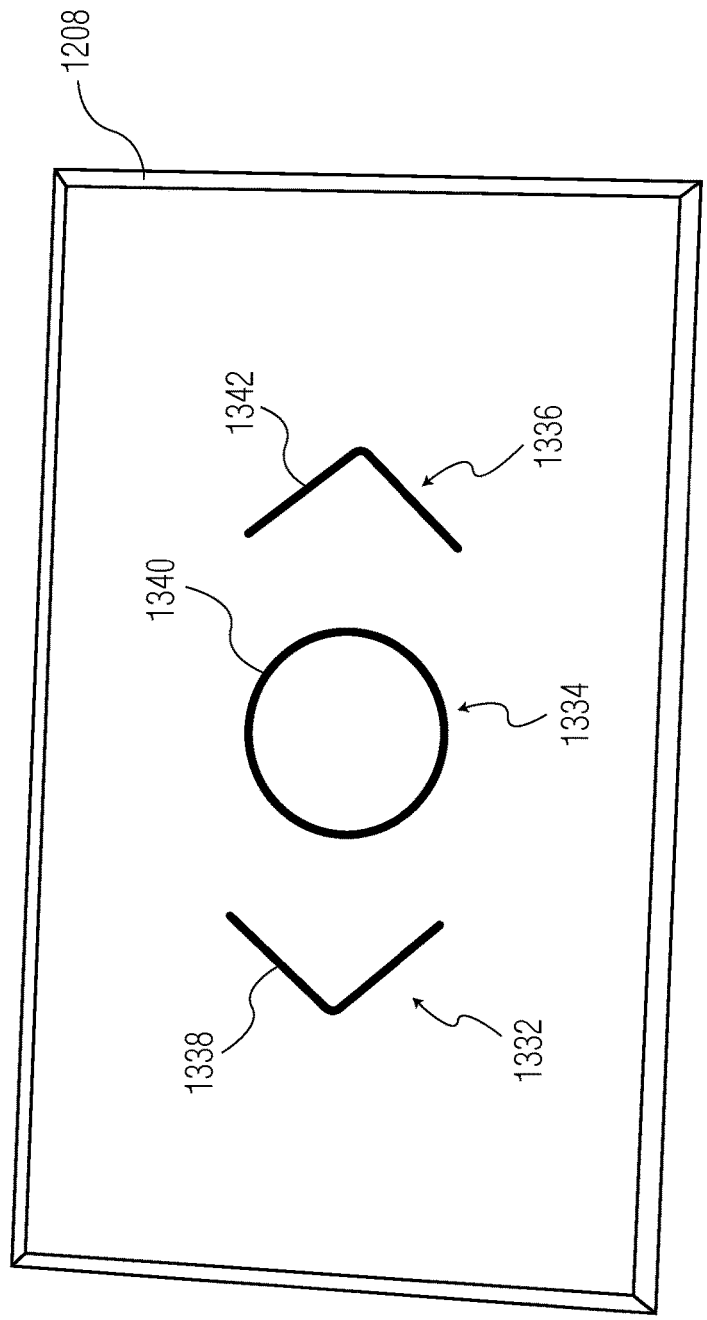

FIGS. 11-13 depict three elegant aesthetic embodiments of the touch panel 1008 depicted in FIG. 10. Touch panels 1108, 1208, 1308 depicted in FIGS. 11-13 may be in the United States (US) dimensions or in Europe (EU) dimensions. For example, the EU edition of the touch panels 1108, 1208, 1308 may have a dimensions of 86×86×11 mm and the US edition of the touch panels 1108, 1208, 1308 may have a dimensions of 8.25×7.3×0.4 inches. In some embodiments, touch panels 1108, 1208, 1308 are capacitive touch panels with capacitive touch sensors.

FIG. 11 depicts a touch panel 1108 that includes one touch sensor 1132. In the embodiment depicted in FIG. 11, the touch sensor 1132 has the form of a circle. For example, the circular area is the area of the touch sensor. Touch the circular area or swipe the circular area can turn on, turn off, or dim (e.g., reduce supplied power) of lighting, climate (i.e., fans), electronic wall outlets, and/or window coverings. The touch sensor 1132 has an LED back light 1136 for the ease of use after dark. The touch sensor 1132 can also produce a sound in each user interaction (e.g., each user touch). The touch sensor 1132 is flat and does not recess into a wall or a gang/patress box, which leaves more room for the electrical device 100 or 200 in the gang box.

FIG. 12 depicts a touch panel 1208 that includes two touch sensors 1232, 1234. In the embodiment depicted in FIG. 12, the touch sensors 1232, 1234 have the form of a circle. For example, the circular area is the area of a respective touch sensor. Touch a respective circular area or swipe a respective circular area can turn on, turn off, or dim (e.g., reduce supplied power) of lighting, climate (i.e., fans), electronic wall outlets, and/or window coverings. For example, the touch sensors 1232, 1234 can be used to switch on and to switch off a load device, such as a light, respectively. In another example, the touch sensor 1232 is used to switch on and off a light while the touch sensor 1234 is used to dim the light. Each of the touch sensors 1232, 1234 has an LED back light 1236 or 1238 for the ease of use after dark. The touch sensors 1232, 1234 can also produce a sound in each user interaction (e.g., each user touch). The touch sensors 1232, 1234 are flat and do not recess into a wall or a gang/patress box, which leaves more room for the electrical device 100 or 200 in the gang box.

FIG. 13 depicts a touch panel 1308 that includes three touch sensors 1332, 1334, 1336. In the embodiment depicted in FIG. 13, the touch sensors 1332, 1336 have the form of an arrow and the touch sensor 1334 has the form of a circle. For example, the circular area or the arrow-shaped area is the area of a respective touch sensor. Touch a respective sensor area or swipe a respective sensor area can turn on, turn off, or dim (e.g., reduce supplied power) of lighting, climate (i.e., fans), electronic wall outlets, and/or window coverings. For example, the touch sensor 1334 may be used to switch on and off a light while the touch sensors 1332, 1336 may be used to dim the light. Each of the touch sensors 1332, 1334, 1336 has an LED back light 1338, 1340, or 1342 for the ease of use after dark. The touch sensors 1332, 1334, 1336 can also produce a sound in each user interaction (e.g., each user touch). The touch sensors 1332, 1334, 1336 are flat and do not recess into a wall or a gang/patress box, which leaves more room for the electrical device 100 or 200 in the gang box.

Figure 14:
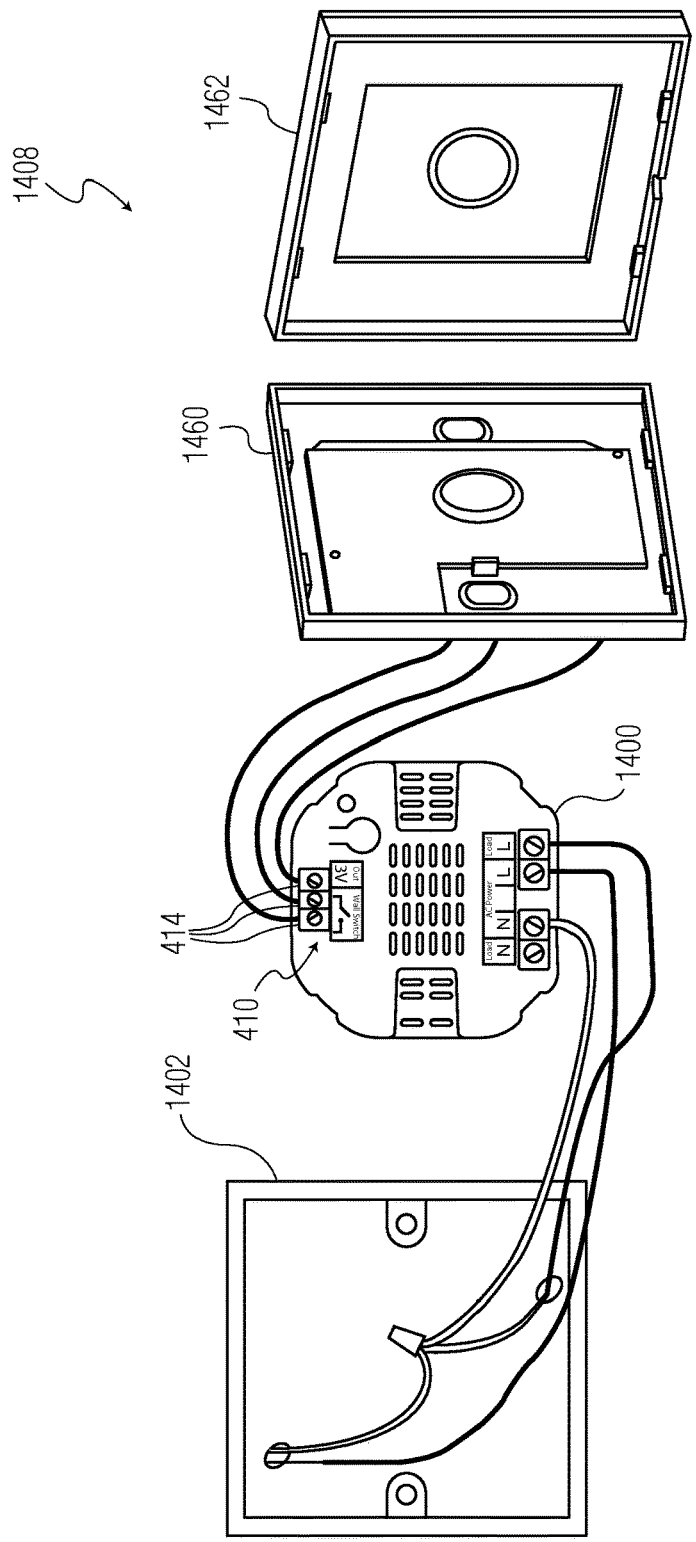
FIGS. 14 and 15 illustrate a process of mounting an electrical device with a touch panel into a wall-mounted electrical gang/patress box.
Figure 15:
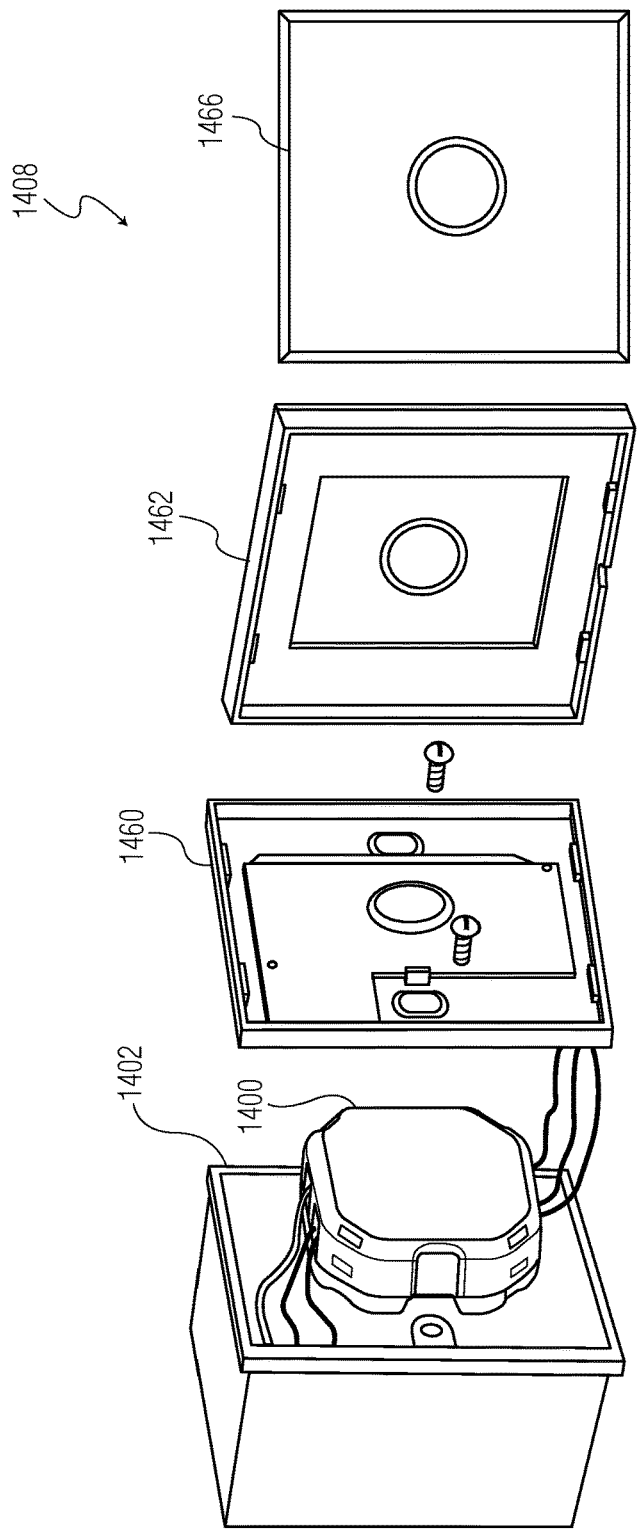

FIGS. 14 and 15 illustrate show a process of mounting an electrical device 1400 with a touch panel 1408 having into an electrical gang/patress box 1402. The electrical device 1400, the touch panel 1408, and the electrical gang/patress box 1402 are similar to or the same as the electrical device 200, the touch panel 1108, and the electrical gang/patress box 102 or 802, respectively. As shown in FIG. 14, the mounting process includes connecting the electrical device 1400 with an AC power supply with wires and connecting the electrical device 1400 with a touch circuit board 1460 of the touch panel 1408 via wires. In the process shown in FIG. 14, all of three sockets controlled by three screws 414 of the DC power interface 410 are used to connect wires between the touch panel 1408 and the electrical device 1400 to supply power to the touch panel 1408, including the touch sensor, the LED back light, or other components, such as, a speaker for sound, of the touch panel 1408. The three sockets controlled by the three screws 414 may have the same voltage potential. For example, all of the three sockets controlled by the three screws 414 have a voltage of around 3.3 Volts (V), for example, within ±10% of 3.3V. Although an example voltage (3.3V) is provided, the voltage of the three sockets controlled by the three screws 414 can be at any suitable value and is not limited to the example provided. As shown in FIG. 15, after the wires connections, the mounting process includes positioning all wires to provide room for the electrical device 1400, placing the electrical device 1400 inside the electrical gang/patress box 1402, screwing back the touch circuit board 1460, and placing a board cover 1462 and a touch sensor cover 1466 on top of the touch circuit board 1460.

Although specific embodiments of the invention that have been described or depicted include several components described or depicted herein, other embodiments of the invention may include fewer or more components to implement less or more feature.

In addition, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A wall mountable touch panel for controlling a load device, the touch panel comprising:

a capacitive touch sensor configured to receive a user touch input, the touch input indicating a manner of controlling the load device based on the user touch input; and a power interface unit that is physically separate from the capacitive touch sensor that is electrically coupled to the load device and to the touch sensor that transmits a low-voltage direct current (DC) power signal to the touch sensor, wherein the touch panel is remotely mounted from the power interface unit and the touch panel transmits a signal to the power interface unit indicating the manner to control the load device, and the power interface unit controls the load device based on the signal transmitted to the power interface unit indicating the manner to control the load device, and the power interface unit controls the load device based on the transmitted signal.

2. The wall mountable touch panel of claim 1, wherein the voltage of the low-voltage DC power signal is lower than a voltage threshold of around 36V.

3. The wall mountable touch panel of claim 1, wherein no alternating current (AC)-DC transformation is performed in the wall mountable touch panel.

4. The wall mountable touch panel of claim 1, wherein the wall mountable touch panel does not transform an alternating current (AC) power signal into the low-voltage DC power signal.

5. The wall mountable touch panel of claim 1, wherein the touch sensor is powered solely by the low-voltage DC power signal.

6. The wall mountable touch panel of claim 1, wherein the wall mountable touch panel does not comprise an alternating current (AC) to DC transformer.

7. The wall mountable touch panel of claim 1, wherein the wall mountable touch panel requires no battery.

8. The wall mountable touch panel of claim 1, wherein the touch sensor is flat and does not recess into a wall on which the wall mountable touch panel is mounted.

9. The wall mountable touch panel of claim 1, wherein the capacitive touch sensor comprises a light-emitting diode (LED) back light.

10. The wall mountable touch panel of claim 1, wherein the capacitive touch sensor is further configured to generate a sound signal in each user interaction.

11. The wall mountable touch panel of claim 1, wherein the capacitive touch sensor has a circular shape or an arrow shape.

12. The wall mountable touch panel of claim 1, wherein the wall mountable touch panel is a resistive touch panel.

13. The wall mountable touch panel of claim 1, wherein the wall mountable touch panel is used to control a light, a fan, an electronic wall outlet, or a window covering.

14. A wall mountable touch panel for controlling a load device, the touch panel comprising:

a capacitive touch sensor configured to receive a user touch input and to control the load device based on the user touch input; and a power interface unit that is physically separate from the capacitive touch sensor that is electrically coupled to the load device and to the touch sensor that transmits a low-voltage direct current (DC) power signal f to the touch sensor, wherein the touch panel is remotely mounted from the power interface to the touch panel and transmits a signal to the power interface to control the power interface.

15. The wall mountable touch panel of claim 14, wherein the touch sensor is further configured to generate a sound signal in each user interaction.

16. A wall mountable capacitive touch panel suitable for use with an electrical gang/patress box, the touch panel comprising:
- a capacitive touch sensor configured to receive a user touch input and to control a light, a fan, an electronic wall outlet, or a window covering based on the user touch input, wherein the capacitive touch sensor is flat and includes an interface for connection to the electrical gang/patress box; and
- a power interface unit that is physically separate from the capacitive touch sensor that is configured to receive a direct current (DC) power signal having a voltage that is lower than an alternating current (AC) power signal that is accessible from within the electrical gang/patress box and to power the capacitive touch sensor,
- wherein no AC-DC transformation is performed in the wall mountable capacitive touch panel, and the touch panel is remotely mounted from the power interface unit and the touch panel and transmits a signal to the power interface to control the power interface.

17. The wall mountable capacitive touch panel of claim 16, wherein the voltage of the low-voltage DC power signal is lower than a voltage threshold of around 36V.

\* \* \* \* \*